United States Patent
Lai et al.

(10) Patent No.: US 10,937,760 B2
(45) Date of Patent: Mar. 2, 2021

(54) METHOD FOR MANUFACTURING A CHIP PACKAGE

(71) Applicant: Comchip Technology Co., Ltd., New Taipei (TW)

(72) Inventors: Chien-Chih Lai, New Taipei (TW); Hung-Wen Lin, New Taipei (TW)

(73) Assignee: COMCHIP TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/406,001

(22) Filed: May 7, 2019

(65) Prior Publication Data
US 2020/0105714 A1 Apr. 2, 2020

(30) Foreign Application Priority Data
Sep. 28, 2018 (TW) .................. 107134515

(51) Int. Cl.
*H01L 23/00* (2006.01)
*H01L 21/027* (2006.01)
(Continued)

(52) U.S. Cl.
CPC .......... *H01L 24/96* (2013.01); *H01L 21/0273* (2013.01); *H01L 21/561* (2013.01);
(Continued)

(58) Field of Classification Search
CPC ..... H01L 21/78; H01L 21/0273; H01L 24/13; H01L 24/96; H01L 2224/95001; H01L 2924/20641; H01L 2924/20642; H01L 24/03; H01L 2224/0401; H01L 2224/1182; H01L 2224/13611; H01L 2224/1162; H01L 2224/03462; H01L 2224/0345; H01L 2224/04105; H01L 2224/94
See application file for complete search history.

(56) References Cited

U.S. PATENT DOCUMENTS

| | | | | | |
|---|---|---|---|---|---|
| 7,943,423 | B2 * | 5/2011 | Pohl | ................ | H01L 21/568 |
| | | | | | 257/E23.116 |
| 2008/0136026 | A1 * | 6/2008 | Yang | ................ | H01L 23/3114 |
| | | | | | 257/738 |

(Continued)

FOREIGN PATENT DOCUMENTS

| CN | 101197336 A | 6/2008 |
|---|---|---|
| TW | 456006 B | 9/2001 |
| TW | 481878 | 4/2002 |

*Primary Examiner* — Caridad Everhart
(74) *Attorney, Agent, or Firm* — CKC & Partners Co., LLC (57) ABSTRACT

A method for manufacturing chip package is disclosed. The method includes providing a wafer having an upper surface and a lower surface opposite thereto, in which the wafer comprises a plurality of conductive pads disposed on the upper surface; dicing the upper surface of the wafer to form a plurality of trenches; forming a patterned photoresist layer on the upper surface and in the trenches; forming a plurality of conductive bumps disposed correspondingly on the conductive pads; thinning the wafer from the lower surface toward the upper surface, such that the patterned photoresist layer in the trenches is exposed from the lower surface; forming an insulating layer under the lower surface; and dicing the patterned photoresist layer and the insulating layer along each trench to form a plurality of chip packages.

9 Claims, 12 Drawing Sheets

(51) Int. Cl.
*H01L 21/78* (2006.01)
*H01L 21/56* (2006.01)

(52) U.S. Cl.
CPC ............ *H01L 21/568* (2013.01); *H01L 21/78* (2013.01); *H01L 24/06* (2013.01); *H01L 24/11* (2013.01); *H01L 24/13* (2013.01); *H01L 2224/0401* (2013.01); *H01L 2224/1162* (2013.01); *H01L 2224/1182* (2013.01); *H01L 2224/13611* (2013.01); *H01L 2224/13655* (2013.01); *H01L 2224/95001* (2013.01); *H01L 2924/2064* (2013.01); *H01L 2924/20641* (2013.01); *H01L 2924/20642* (2013.01)

(56) References Cited

U.S. PATENT DOCUMENTS

2012/0034760 A1* 2/2012 Schuderer ............... H01L 21/78
  438/462
2012/0208009 A1* 8/2012 Oda ......................... H01L 21/78
  428/336

* cited by examiner

Fig. 12

METHOD FOR MANUFACTURING A CHIP PACKAGE

CROSS-REFERENCE TO RELATED APPLICATION

This application claims priority to Taiwan Application Serial Number 107134515, filed Sep. 28, 2018, which is herein incorporated by reference.

BACKGROUND

Field of Invention

The present disclosure relates to a method of manufacturing a chip package.

Description of Related Art

In one conventional chip packaging process, semiconductor dies are formed by dicing a wafer and are packaged one by one, which is quite time-consuming and complicated. In an alternative process, a plurality of chip packages is formed by arranging the semiconductor dies one by one on a carrier board, followed by performing a packaging process and a dicing process. This method of manufacturing chip packages is time-consuming and complicated as well, and an alignment offset issue is likely to occur.

SUMMARY

In view of this, one purpose of the present disclosure is to provide a method of manufacturing a chip package to address the abovementioned issues.

One aspect of the present disclosure is to provide a method of manufacturing a chip package. The method includes steps of providing a wafer having an upper surface and a lower surface opposite thereto, in which the wafer includes a plurality of conductive pads disposed on the upper surface; dicing the upper surface of the wafer to form a plurality of trenches; forming a patterned photoresist layer on the upper surface and in the trenches; forming a plurality of conductive bumps disposed correspondingly on the conductive pads; thinning the wafer from the lower surface toward the upper surface, such that the patterned photoresist layer in the trenches is exposed from the lower surface; forming an insulating layer under the lower surface; and dicing the patterned photoresist layer and the insulating layer along each trench to form a plurality of chip packages.

According to one embodiment of the present disclosure, after the step of forming the conductive bumps, the method further includes forming a surface treatment layer on the conductive bumps.

According to one embodiment of the present disclosure, after the step of forming the conductive bumps and before the step of thinning the wafer, the method further includes forming an adhesive layer that covers the patterned photoresist layer and the conductive bumps; and forming a carrier board on the adhesive layer.

According to one embodiment of the present disclosure, after the step of forming the insulating layer and before the step of dicing the patterned photoresist layer and the insulating layer along each trench, the method further includes removing the carrier board and the adhesive layer.

According to one embodiment of the present disclosure, after the step of thinning the wafer, a thickness of the wafer ranges from 100 µm to 150 µm.

According to one embodiment of the present disclosure, after the step of forming the insulating layer, a total thickness of the wafer, the conductive bumps, and the insulating layer ranges from 120 µm to 210 µm.

According to one embodiment of the present disclosure, a dicing width of dicing the patterned photoresist layer and the insulating layer along each trench ranges from 15 µm to 22 µm.

According to one embodiment of the present disclosure, a height of each conductive bump ranges from 20 µm to 45 µm.

According to one embodiment of the present disclosure, a width of each trench ranges from 50 µm to 60 µm, and a depth of each trench ranges from 150 µm to 200 µm.

According to one embodiment of the present disclosure, after the step of providing the wafer, a thickness of the wafer ranges from 525 µm to 725 µm.

BRIEF DESCRIPTION OF THE DRAWINGS

The invention can be more fully understood by reading the following detailed description of the embodiment, with reference made to the accompanying drawings as follows.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. Other embodiments may be added to an embodiment without further description.

In the following description, certain specific details are set forth in order to provide a thorough understanding of various embodiments of the invention. However, one skilled in the art will understand that the invention may be practiced without these specific details. In other instances, well-known structures and devices are only schematically illustrated in the drawings in order to simplify the drawings.

Figure 1:
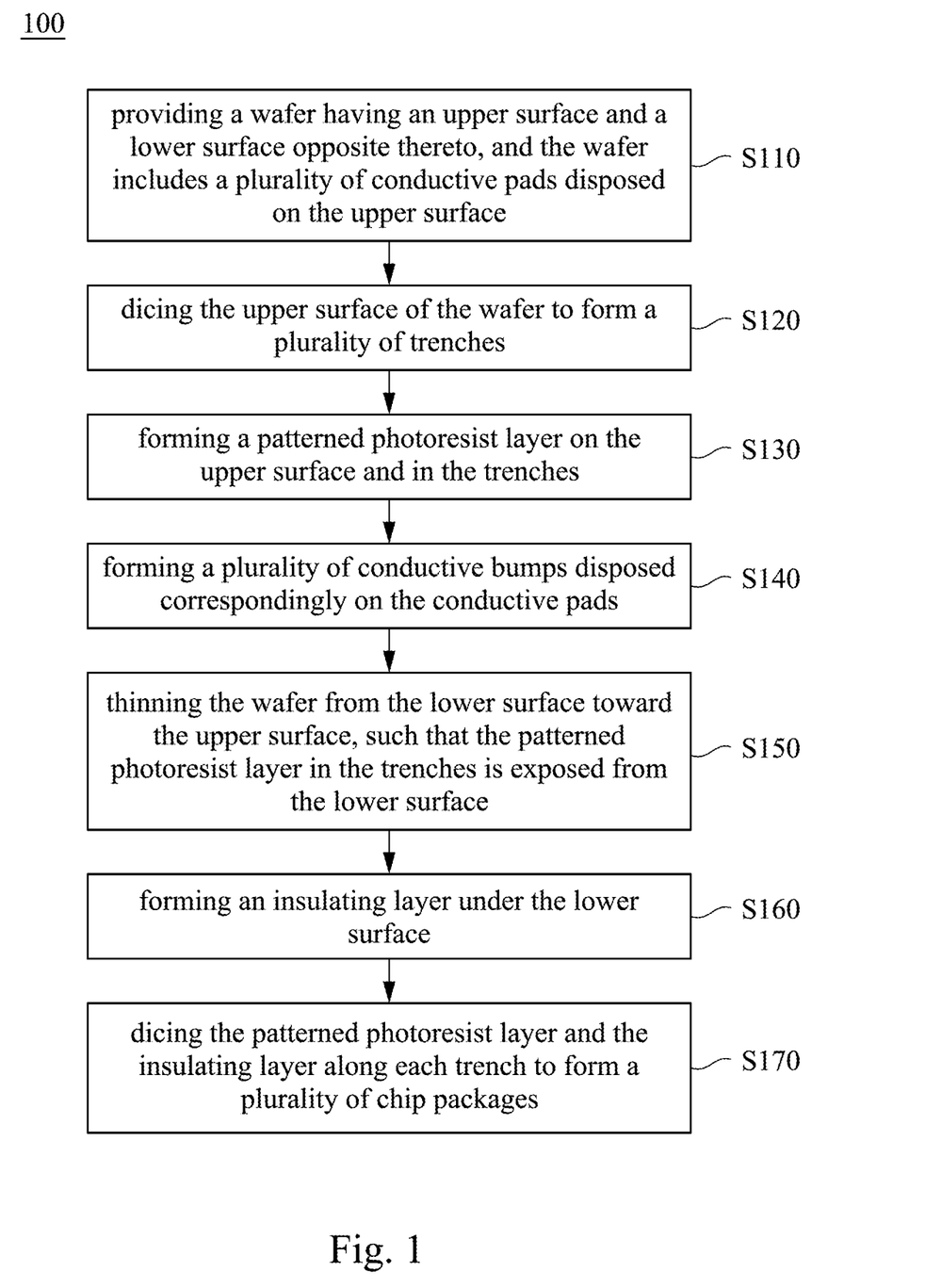
FIG. 1 depicts a flowchart of a method of manufacturing chip packages according to one embodiment of the present disclosure.

One aspect of the present disclosure is to provide a method of manufacturing a chip package. The method may reduce the process duration and costs, and the alignment offset issue can be eliminated. FIG. 1 depicts a flowchart of a method 100 of manufacturing chip packages according to one embodiment of the present disclosure. FIGS. 2 through FIG. 11 are schematic sectional views of intermediate stages in the manufacturing of chip packages according to one embodiment of the present disclosure. As shown in FIG. 1, the method 100 includes step S110, step S120, step S130, step S140, step S150, step S160, and step S170.

Figure 2:
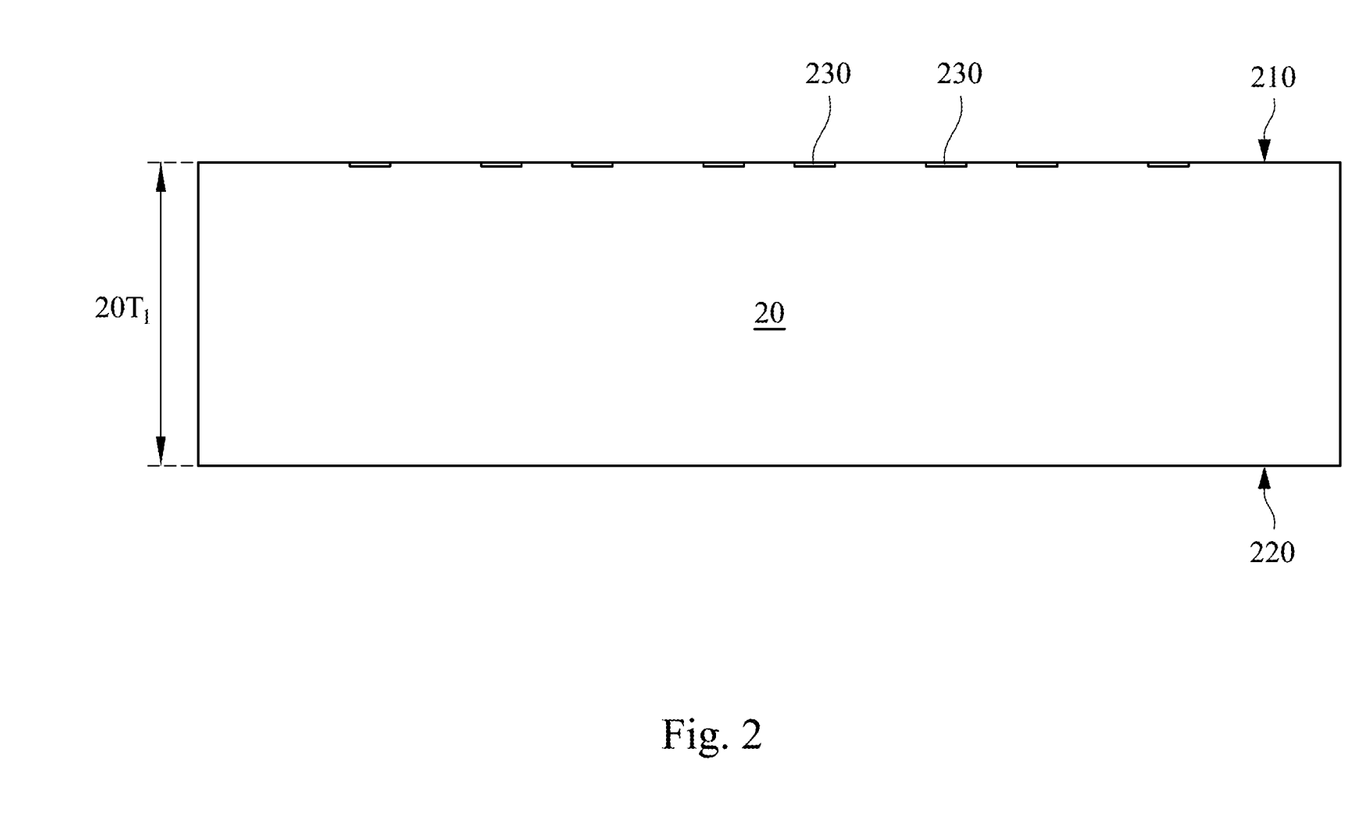
FIGS. 2 through 12 are schematic sectional views of intermediate stages in the manufacturing of chip packages according to one embodiment of the present disclosure.

At step S110, a wafer 20 is provided, as shown in FIG. 2. Specifically, the wafer 20 has an upper surface 210 and a lower surface 220 opposite thereto. In addition, the wafer 20 includes a plurality of conductive pads 230 disposed on the upper surface 210. In one example, the wafer 20 may include silicon, germanium, or a Group III to Group V element, but is not limited thereto. In some examples, the conductive pads 230 include copper, nickel, tin, or other suitable conductive material. In some examples, a thickness $20T_1$ of the wafer 20 may range from 525 µm to 725 µm, such as may be 550 µm, 575 µm, 600 µm, 625 µm, 650 µm, 675 µm, or 700 µm.

Figure 3:
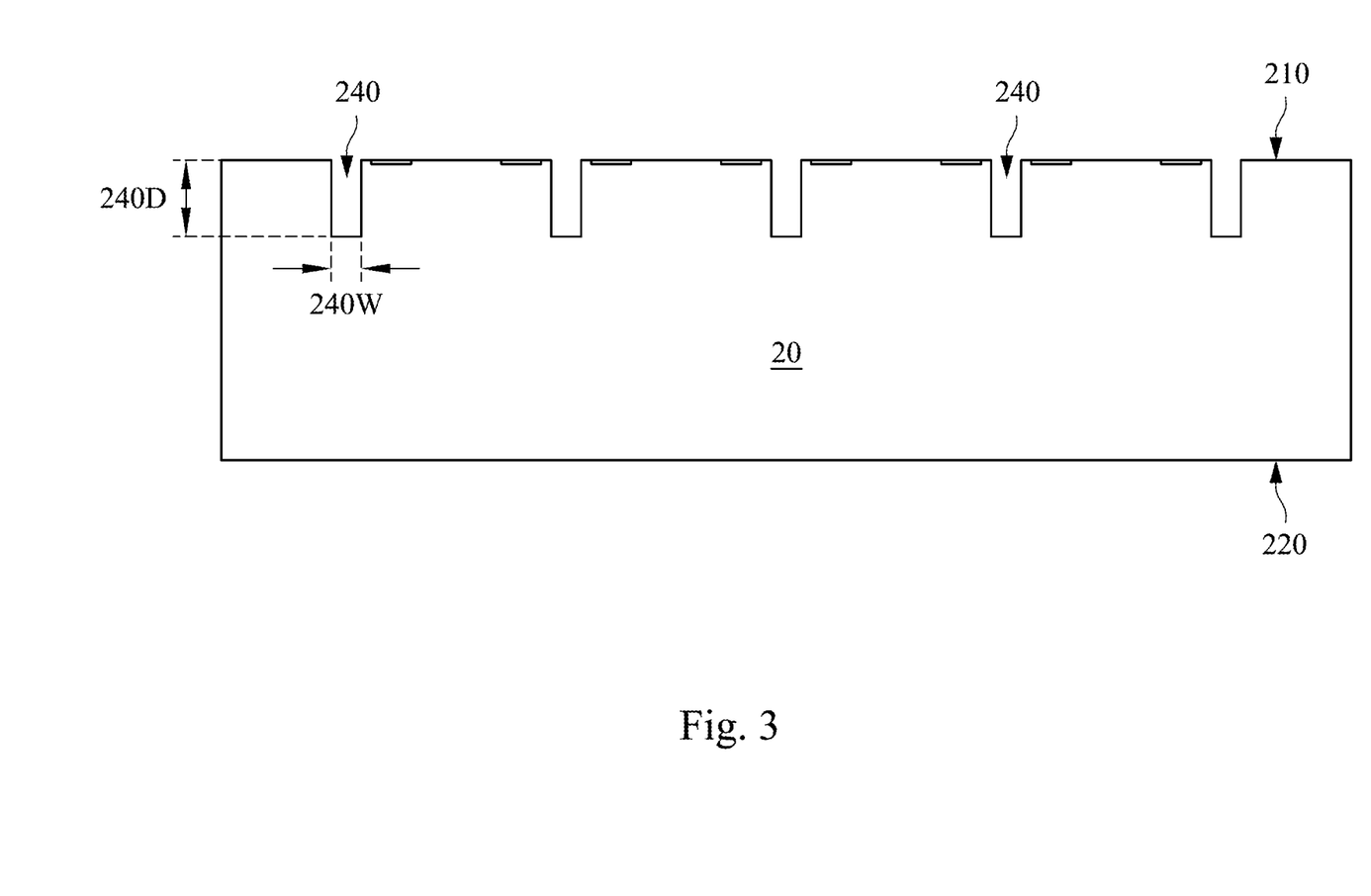

At step S120, the upper surface 210 of the wafer 20 is diced to form a plurality of trenches 240, as shown in FIG. 3. In some examples, step S12 may be done by a wheel cutting process, a laser cutting process, or a waterjet cutting process. In one example, a width 240W of each trench 240 ranges from 50 µm to 60 µm, and a depth 240D of each trench 240 ranges from 120 µm to 200 µm. For example, the width 240W may be 51 µm, 52 µm, 53 µm, 54 µm, 55 µm, 56 µm, 57 µm, 58 µm, or 59 µm, and the depth 240D may be 125 µm, 130 µm, 135 µm, 140 µm, 145 µm, 150 µm, 155 µm, 160 µm, 165 µm, 170 µm, 175 µm, 180 µm, 185 µm, 190 µm, or 195 µm, but is not limited thereto.

Figure 4:
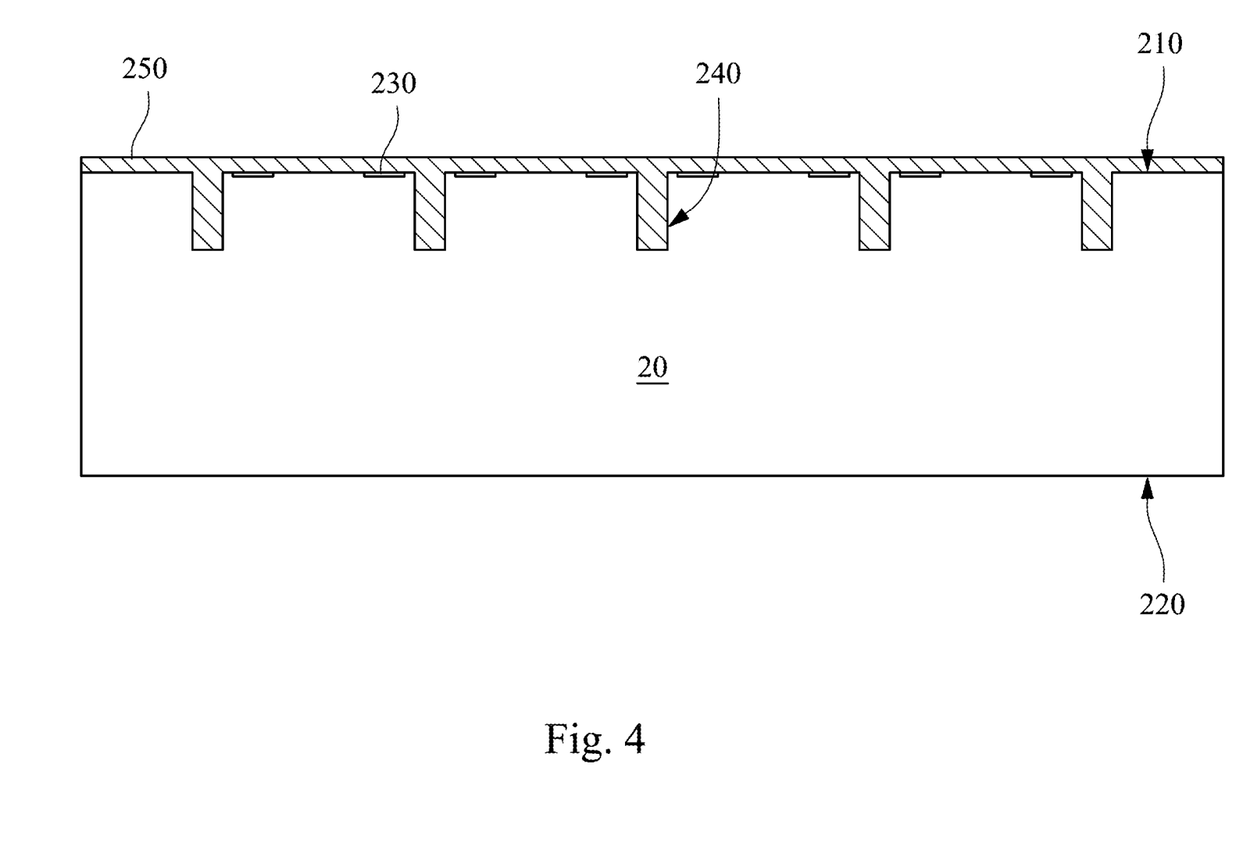
Figure 5:
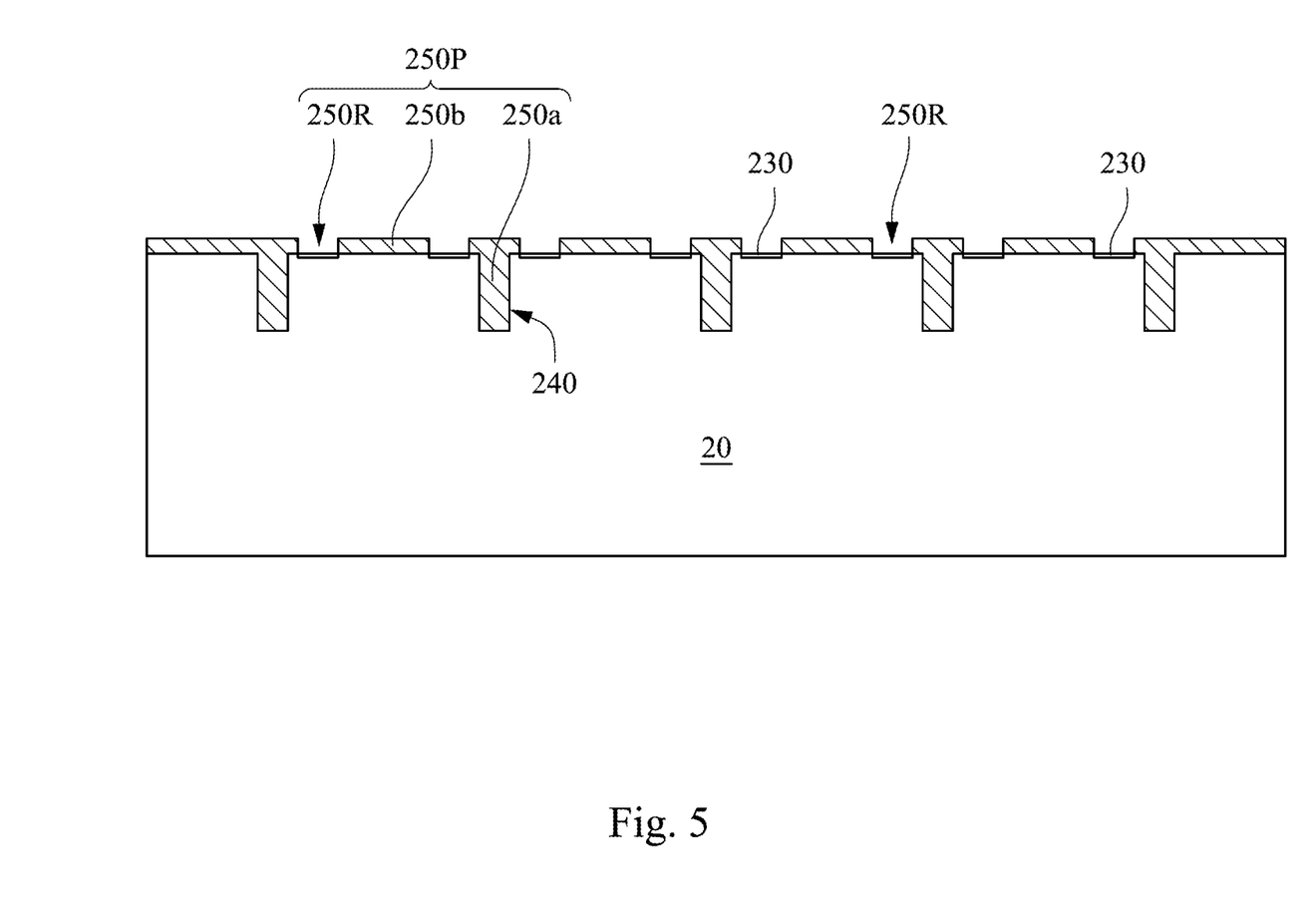

At step S130, a patterned photoresist layer is formed on the upper surface and in the trenches. FIGS. 4 through 5 are schematic sectional views according to one embodiment of the present disclosure for implementing step S130. As shown in FIG. 4, a photoresist layer 250 is formed filling the trenches 240 and covering the upper surface 210 of the wafer 20. In one example, the photoresist layer 250 with a certain thickness is formed on the upper surface 210 of the wafer 20. In some examples, the photoresist layer 250 may be a positive photoresist layer or a negative photoresist layer. In one example, the photoresist layer 250 may be formed by a spraying process, a printing process, a coating process, or an electrodeposition process of photoresist.

Next, as shown in FIG. 5, in one embodiment, an exposure and developing process may be performed, such that a patterned photoresist layer 250P is formed from the photoresist layer 250. The patterned photoresist layer 250P includes a first portion 250a and a second portion 250b. The first portion 250a is filled in the trenches 240. The second portion 250b is disposed between any two adjacent conductive pads 230 on the upper surface 210. In detail, the photoresist layer 250 may be exposed by using a mask (not shown) with certain patterns and ultraviolet light of suitable wavelength (not shown). It is noted that in the case the photoresist layer 250 is a positive photoresist layer, an exposed portion of the photoresist layer is washed away in a subsequent development step, while the unexposed portion of the photoresist layer remains. In other words, as shown in FIG. 5, a plurality of recesses 250R is formed in the patterned photoresist layer 250P and the conductive pads 230 are exposed from the recesses 250R. In other words, the remaining portion is not exposed to the ultraviolet light by the shielding of the mask. It is noted that during the exposure and developing of the photoresist layer 250, the portion of the photoresist layer 250 that is disposed in the recesses 250R are exposed, developed and then removed, such that the conductive pads 230 on the upper surface 210 of the wafer 20 are exposed. To the contrary, in the case the photoresist layer 250 is a negative photoresist layer, the portion of the photoresist layer 250 that is disposed in the recesses 250R is shielded by a mask and is not exposed to ultraviolet light. The portion of the photoresist layer 250 is washed away in the subsequent developing process.

Figure 6:
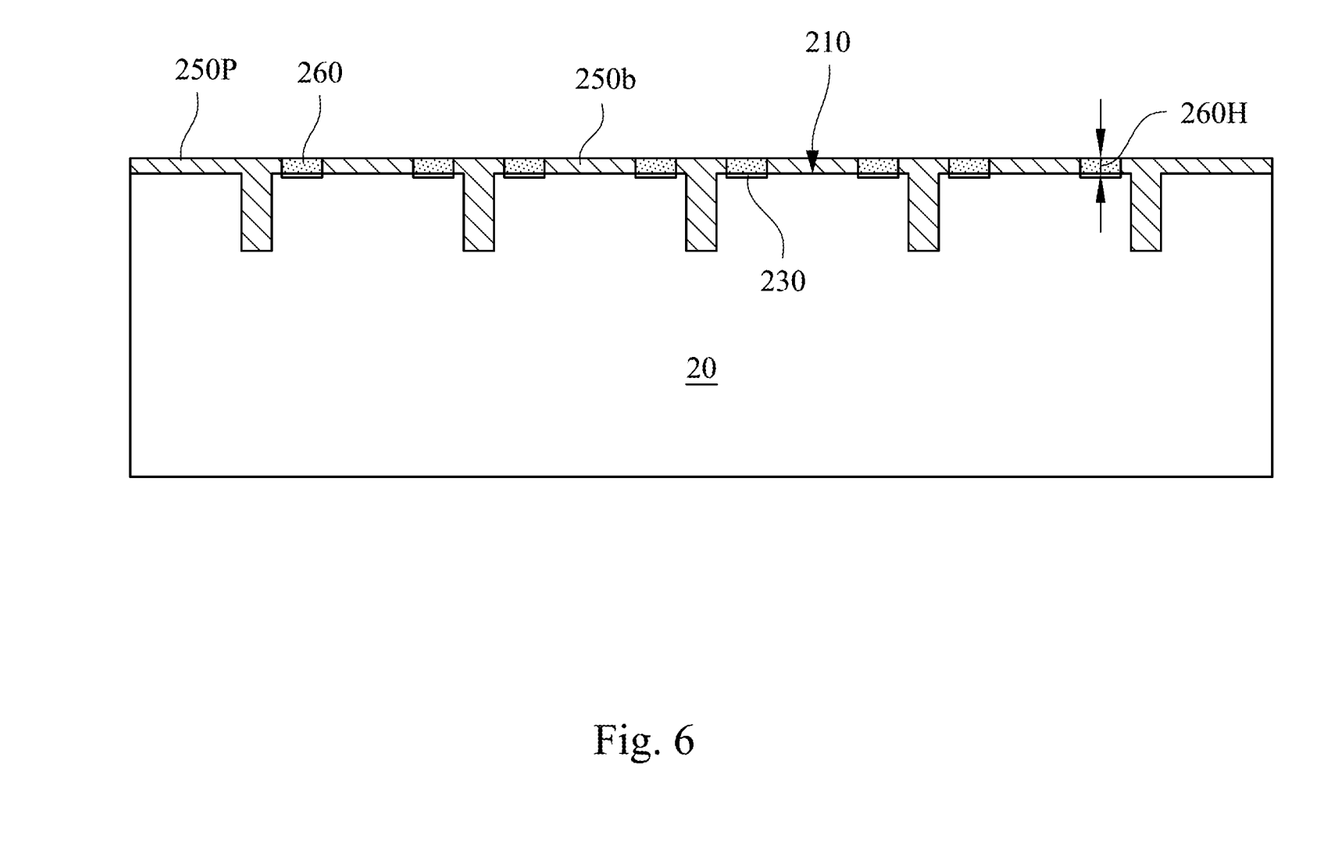

At step S140, a plurality of the conductive bumps 260 is formed correspondingly on the conductive pads 230, as shown in FIG. 6. In one example, a height 260H of the conductive bumps 260 ranges from 20 µm to 45 µm, such as 22 µm, 24 µm, 26 µm, 28 µm, 30 µm, 32 µm, 34 µm, 36 µm, 38 µm, 40 µm, 42 µm, or 44 µm. In some examples, a top surface of the conductive bumps 260 may be slightly higher than, level with, or slightly lower than a top surface of the patterned photoresist layer 250P. In some examples, the conductive bumps 260 include gold, tin, copper, nickel, or other suitable metal material. In some examples, the conductive bumps 260 may be formed by an electroplating process, a sputtering process, an evaporation process, or other suitable processes. It is noted that the second portion 250b of the patterned photoresist layer 250P may serve as a mask during the formation of the conductive bumps 260, such that a photolithography and etching process of a metal material layer can be omitted. In addition, the second portion 250b of the patterned photoresist layer 250P may serve as a sealing layer of the subsequently formed chip package to protect the upper surface 210 of the wafer 20.

Figure 7:
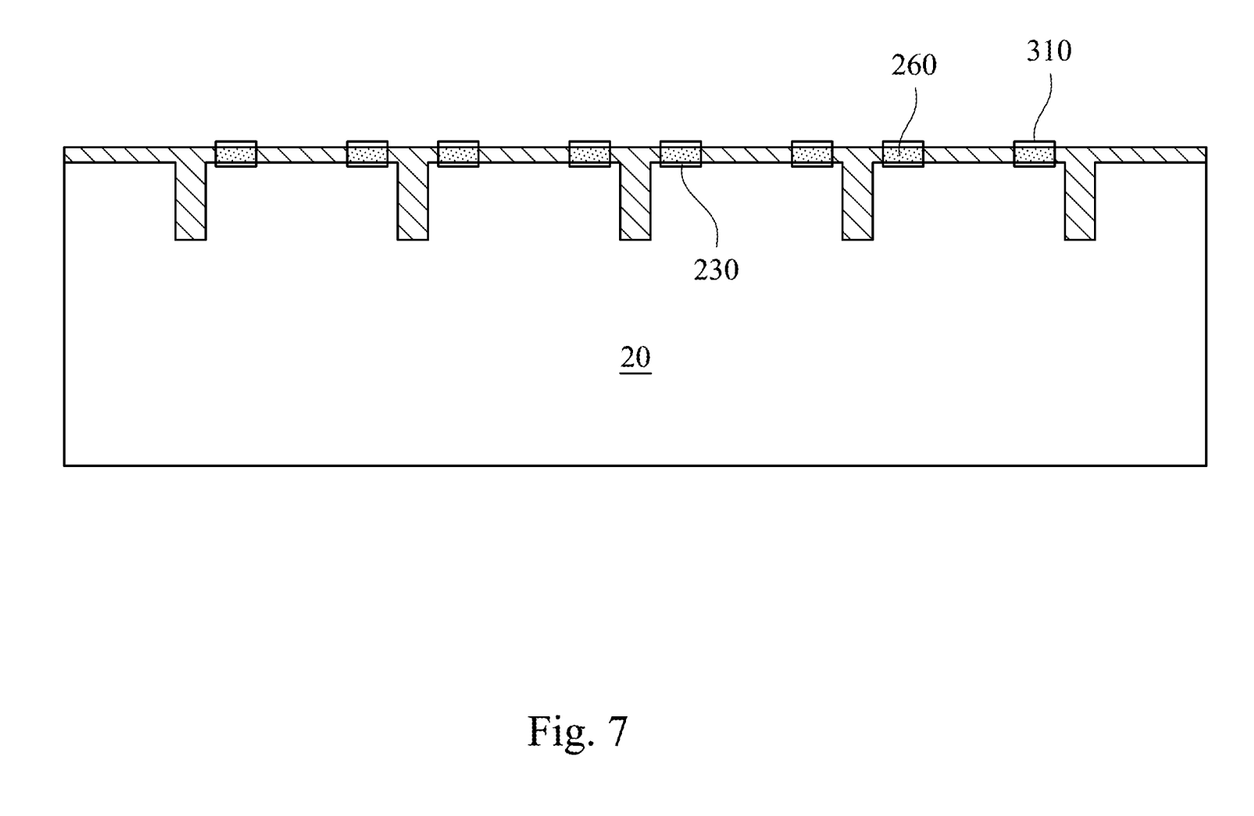

Next, reference is made to FIG. 7. In some embodiments, a surface treatment layer 310 may be formed on the conductive bumps 260 after performing step S140 by forming the conductive bumps 260. In some examples, the surface treatment layer 310 may be a single-layered structure or a multilayered structure composed of sublayers with different materials, in which the single-layered structure may be a nickel layer or a tin layer, and the multilayered structure may be a stacked layer of nickel layer and tin layer, but is not limited thereto. The surface treatment layer 310 may be formed by a physical process or a chemical process. The physical process may include but not limited to an electrolytic gold/nickel process and a hot air solder leveling process. The chemical process may include but not limited to an electroless nickel immersion gold (ENIG) process. The surface treatment layer 310 may prevent the conductive bumps 260 from being oxidized by the air.

Figure 8:
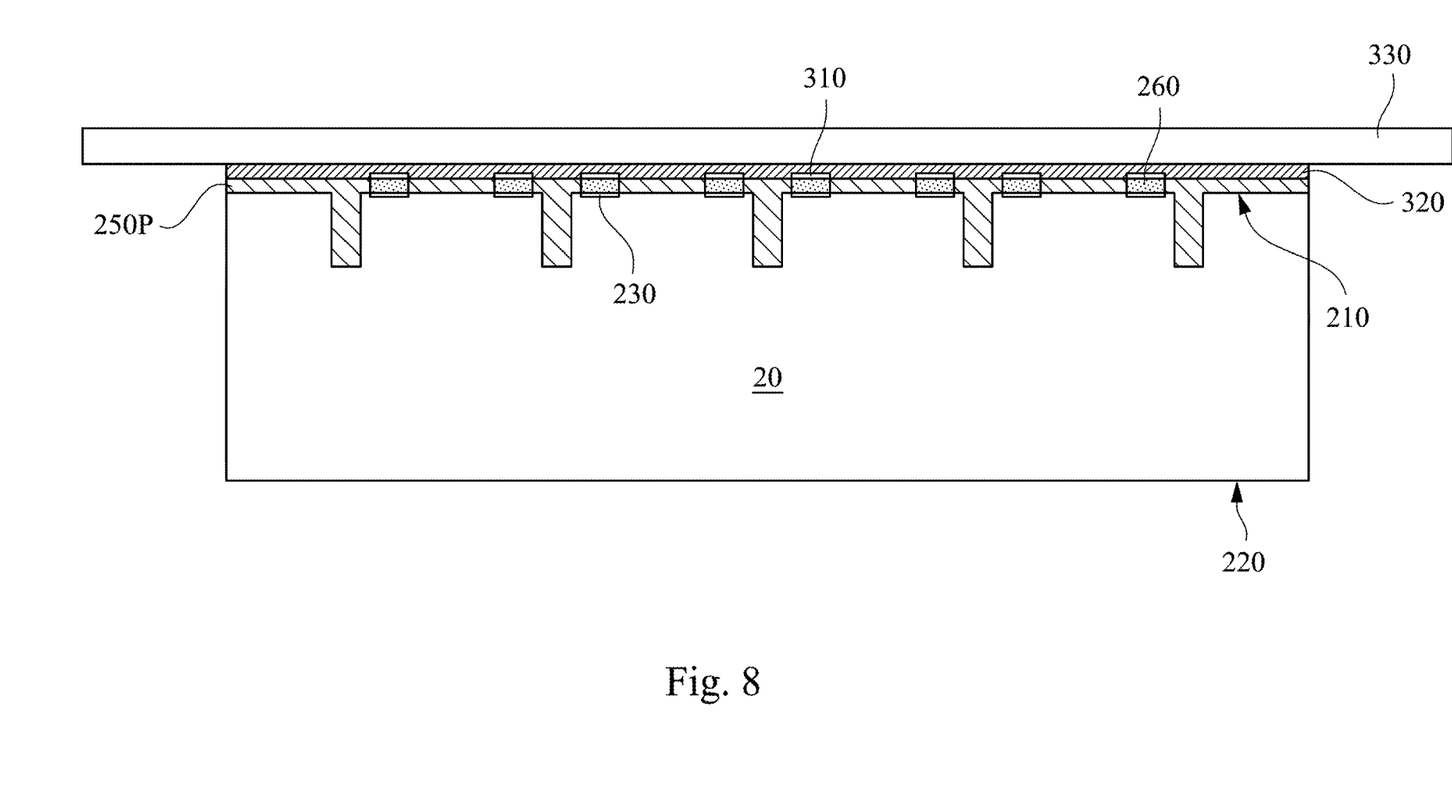

Reference is made to FIG. 8. After step S140 is completed, an adhesive layer 320 is formed covering the patterned photoresist layer 250P and the conductive bumps 260. A carrier board 330 is formed subsequently on the adhesive layer 320. The adhesive layer 320 may reduce the stress occurred during the subsequent thinning process and prevent the wafer 20 from cracking. In one example, the adhesive layer 320 includes a UV release adhesive or a thermal release adhesive. In one example, the adhesive layer 320 may be formed by a spin coating process, but is not limited thereto. The carrier board 330 may provide excellent protection for the wafer 20. The carrier board 330 may be a rigid insulating substrate, such as a glass substrate, a ceramic substrate, a sapphire substrate, or a quartz substrate, but is not limited thereto.

In other embodiments, after the formation of the surface treatment layer 310 on the conductive bumps 260, the adhesive layer 320 is formed covering the patterned photoresist layer 250P and the surface treatment layer 310. The carrier board 330 is formed subsequently on the adhesive layer 320.

Figure 9:
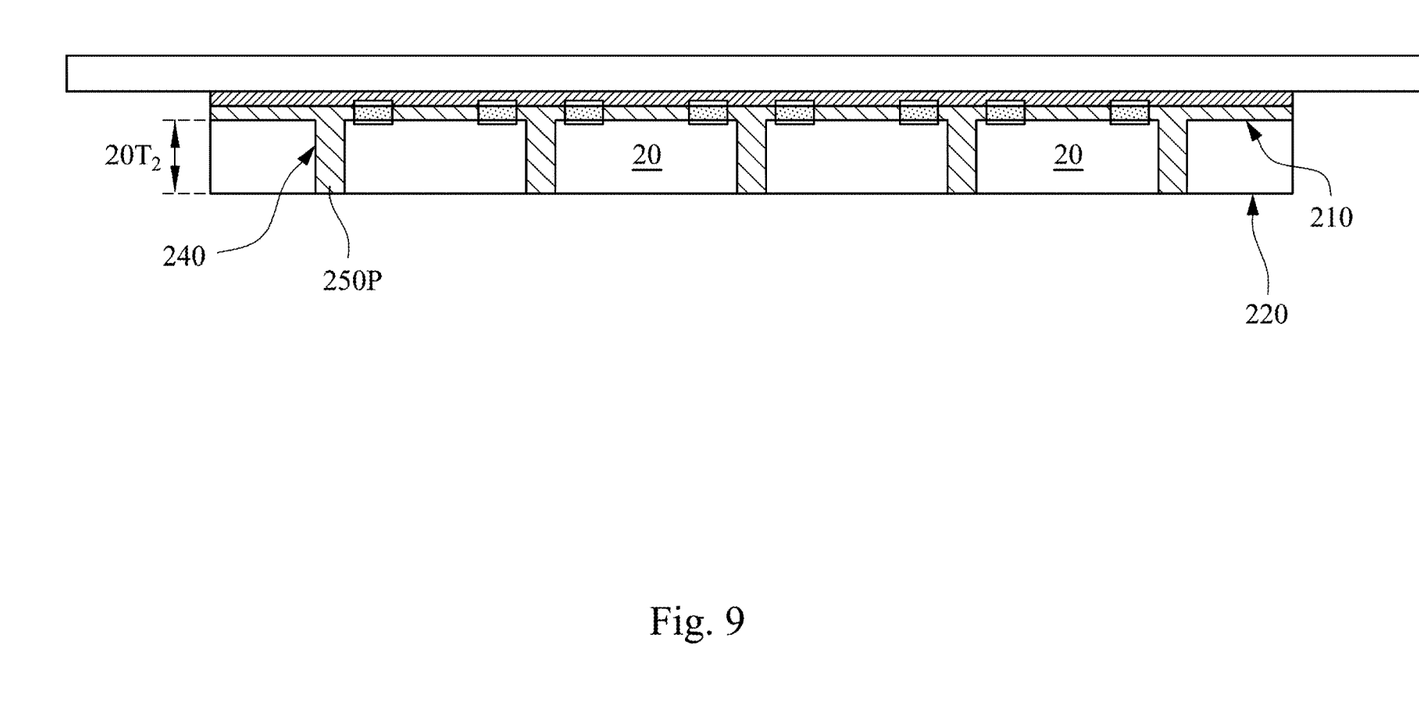

At step S150, the wafer 20 is thinned from the lower surface 220 toward the upper surface 210, such that the patterned photoresist layer 250P in the trenches 240 are exposed from the lower surface 220, as shown in FIG. 9. The wafer 20 may be thinned by a chemical-mechanical polishing process, a dry-etching process or other suitable processes, such that the subsequently formed chip package may have a smaller size. In some examples, after performing the step S150 by thinning the wafer 20, the thickness $20T_2$ of the wafer 20 ranges from 100 µm to 150 µm, such as 110 µm, 115 µm, 120 µm, 125 µm, 130 µm, 135 µm, 140 µm, or 145 µm. After step S150 is completed, the wafer 20 is diced into a plurality of chips. The relative position of the chips remains unchanged due to the presence of the patterned photoresist layer 250P in the trenches 240. In this way, the alignment offset issue in the prior art can be eliminated.

Figure 10:
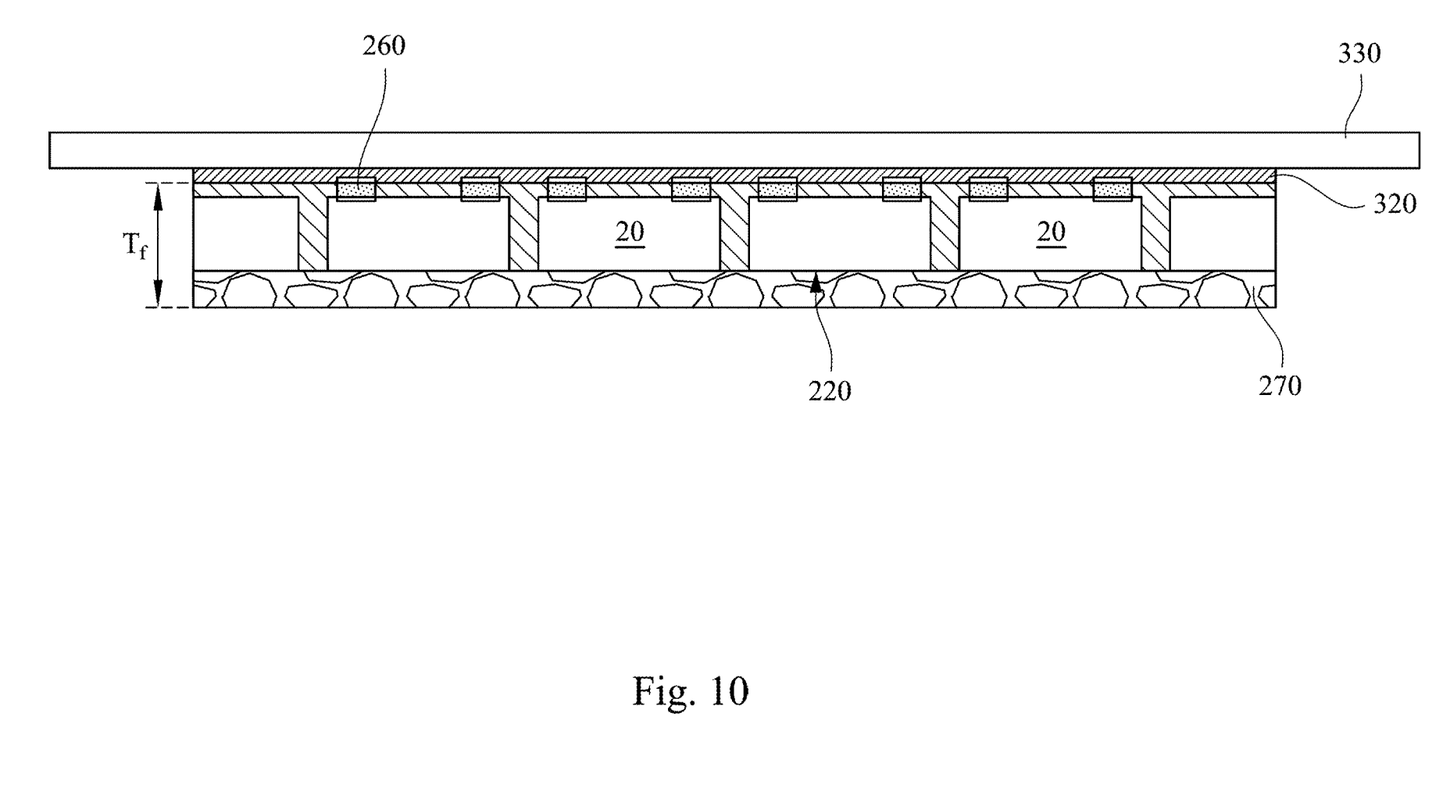

At step S160, an insulating layer 270 is formed under the lower surface 220, as shown in FIG. 10. The insulating layer 270 may serve as a sealing layer of the chip package to protect the lower surface 220 of the wafer 20. In some examples, the insulating layer 270 may be made of polyimide, epoxy or other suitable insulating material. In some examples, the insulating layer 270 may be formed by a printing process, a coating process or a molding process. In the present example, when the step S160 is completed with the formation of the insulating layer 270, the total thickness $T_f$ of the wafer 20, the insulating layer 270, and the conductive bumps 260 ranges from 120 μm to 210 μm, such as 125 μm, 130 μm, 135 μm, 140 μm, 145 μm, 150 μm, 155 μm, 160 μm, 165 μm, 170 μm, 175 μm, 180 μm, 185 μm, 190 μm, 195 μm, 200 μm, or 205 μm.

Figure 11:
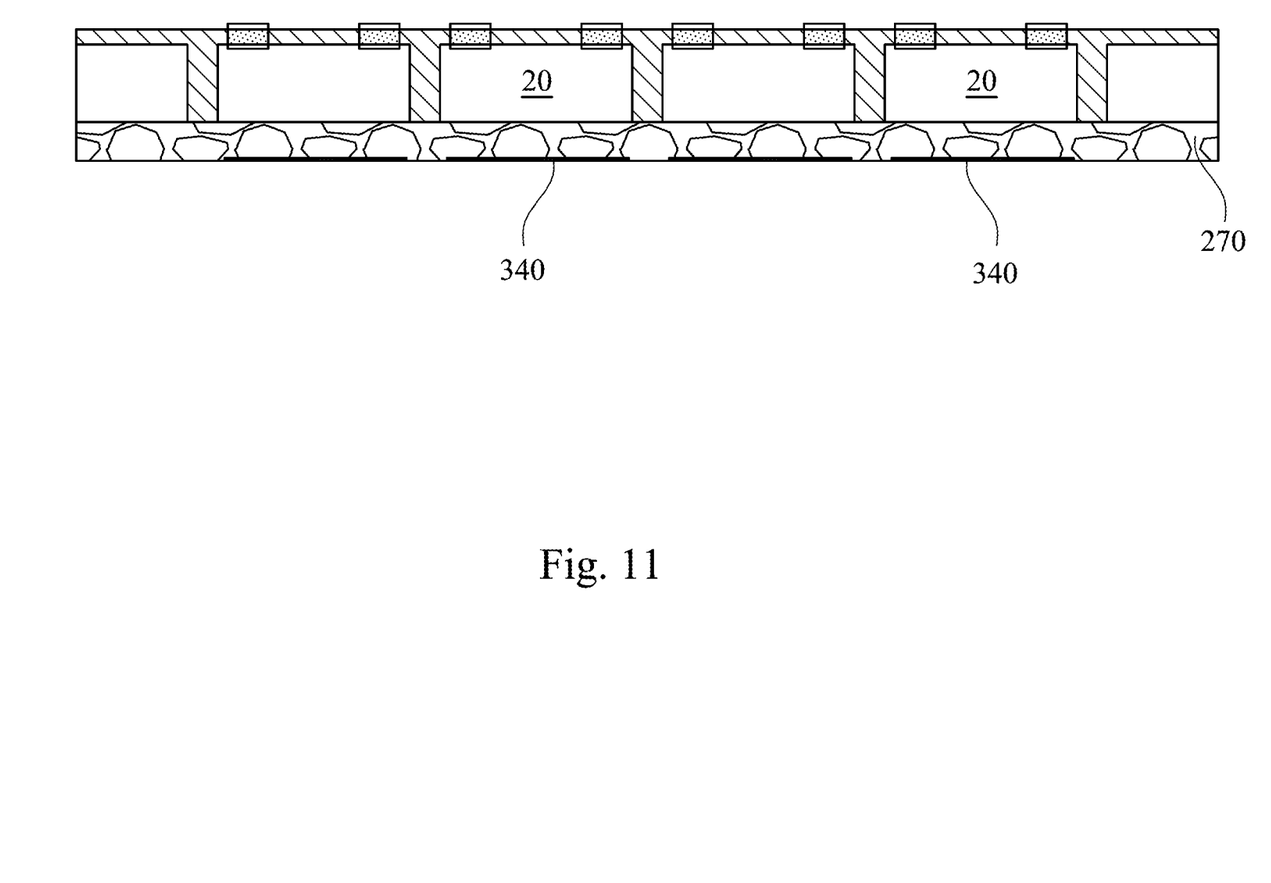

Reference is made to FIG. 11. When the step S160 is completed with the formation of the insulating layer 270, the carrier board 330 and the adhesive layer 320 are removed. In detail, an ultraviolet irradiation treatment or a heating treatment may be performed on the adhesive layer 320, such that the carrier board 330 is separated from the adhesive layer 320 due to weak adhesion.

As shown in FIG. 11, in some examples, after the step S160 is completed with the formation of the insulating layer 270, a laser mark 340 may be formed on the insulating layer 270 of each chip.

Figure 12:
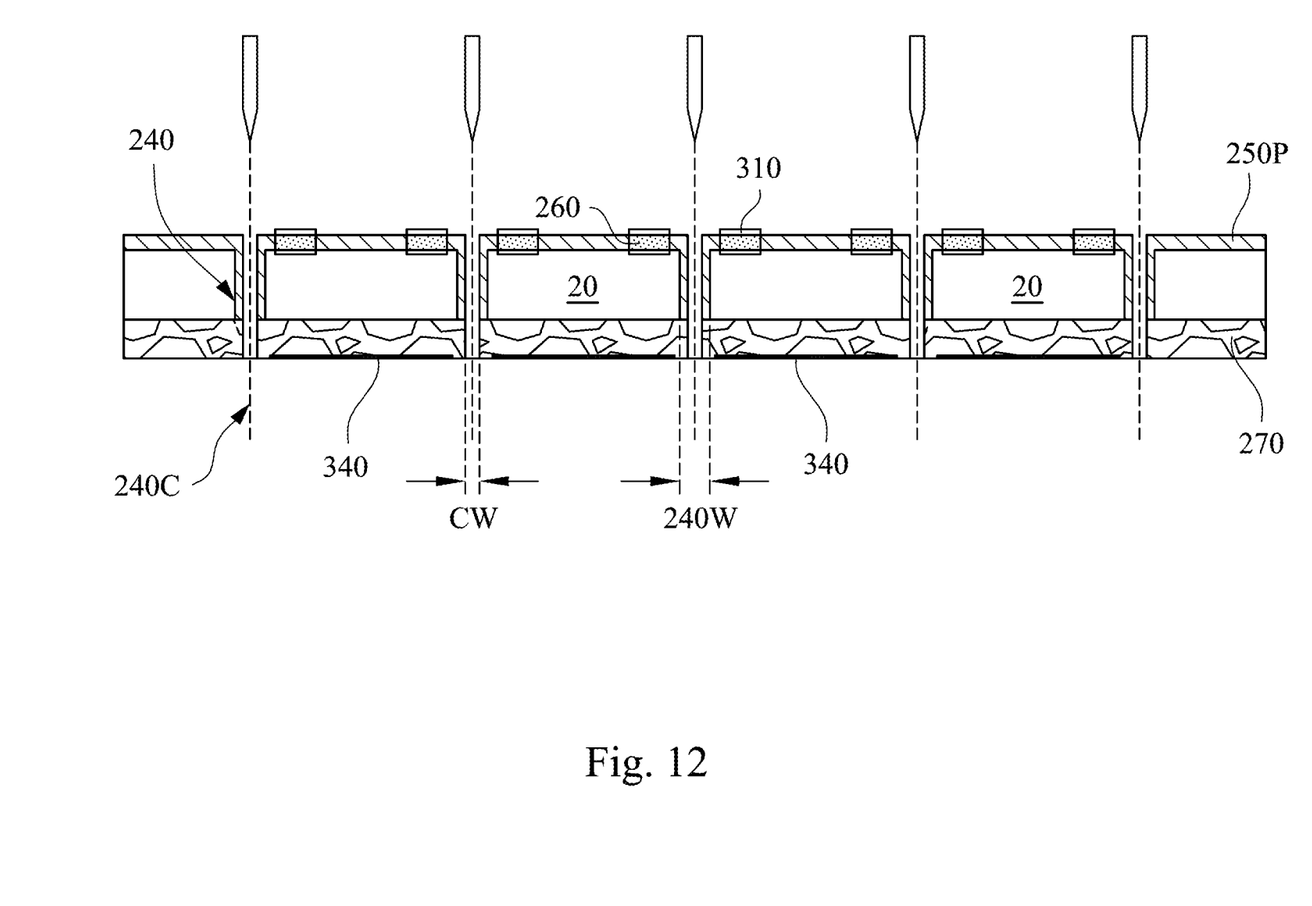

At step S170, the patterned photoresist layer 250P and the insulating layer 270 are diced along each trench 240 to form a plurality of chip packages, as shown in FIG. 12. In one example, the patterned photoresist layer 250P and the insulating layer 270 are diced along a center 240C of each trench 240 to form a plurality of chip packages. In some examples, the step S170 may be done by a wheel cutting process, a laser cutting process, or a waterjet cutting process. In the present example, a dicing width CW of dicing the patterned photoresist layer 250P and the insulating layer 270 along each trench 240 ranges from 15 μm to 22 μm, such as 15.5 μm, 16.0 μm, 16.5 μm, 17.0 μm, 17.5 μm, 18.0 μm, 18.5 μm, 19.0 μm, 19.5 μm, 20.0 μm, 20.5 μm, 21.0 μm, or 21.5 μm. It is noted that the dicing width CW is smaller than a width 240W of the trenches 240. Therefore, when the step S170 is completed, a portion of the patterned photoresist layer 250P may remain on the sidewalls of each chip package adjacent to the center 240C and protect the wafer 20. In other words, every surface of the chip package is protected by the patterned photoresist layer 250P and/or the insulating layer 270, except that the surface treatment layer 310 is exposed and serves to be electrically connected to other electrical components.

In various examples, the chip packages may be applied in light-sensing elements packaging or light-emitting elements packaging, but the application is not limited thereto. For example, the chip packages may be applied in electronic components of various integrated circuits that including discrete components, active or passive elements, digital or analog circuits, for example optoelectronic devices, micro electro mechanical system (MEMS), microfluidic systems, or physical sensors that measures the variation of some physical quantities such as heat, light, or pressure. Notably, a wafer scale package process (WSP) process may be applied for packaging semiconductor chips such as image-sensing elements, light-emitting diodes (LEDs) or non-light-emitting diodes, solar cells, RF circuits, accelerators, gyroscopes, micro actuators, surface acoustic wave devices, process sensors, or ink printer heads, and the like.

In summary, the method of manufacturing chip packages disclosed in the present invention may reduce process duration and cost, and the alignment offset can be eliminated.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing chip package, comprising steps of:
   providing a wafer having an upper surface and a lower surface opposite thereto, wherein the wafer comprises a plurality of conductive pads disposed on the upper surface;
   dicing the upper surface of the wafer to form a plurality of trenches;
   forming a patterned photoresist layer on the upper surface and in the trenches;
   forming a plurality of conductive bumps disposed correspondingly on the conductive pads;
   thinning the wafer from the lower surface toward the upper surface, such that the patterned photoresist layer in the trenches is exposed from the lower surface;
   forming an insulating layer under the lower surface; and
   dicing the patterned photoresist layer and the insulating layer along each trench to form a plurality of chip packages, wherein a dicing width of dicing the patterned photoresist layer and the insulating layer along each trench ranges from 15 μm to 22 μm.

2. The method of claim 1, after the step of forming the conductive bumps, further comprising forming a surface treatment layer on the conductive bumps.

3. The method of claim 1, after the step of forming the conductive bumps and before the step of thinning the wafer, further comprising:
   forming an adhesive layer covering the patterned photoresist layer and the conductive bumps; and
   forming a carrier board on the adhesive layer.

4. The method of claim 3, after the step of forming the insulating layer and before the step of dicing the patterned photoresist layer and the insulating layer along each trench, further comprising removing the carrier board and the adhesive layer.

5. The method of claim 1, wherein after the step of thinning the wafer, a thickness of the wafer ranges from 100 μm to 150 μm.

6. The method of claim 1, wherein after the step of forming the insulating layer, a total thickness of the wafer, the conductive bumps, and the insulating layer ranges from 120 μm to 210 μm.

7. The method of claim 1, wherein a height of each conductive bump ranges from 20 μm to 45 μm.

8. The method of claim 1, wherein a width of each trench ranges from 50 μm to 60 μm, and a depth of each trench ranges from 150 μm to 200 μm.

9. The method of claim 1, after the step of providing the wafer, a thickness of the wafer ranges from 525 μm to 725 μm.

* * * * *